(12) United States Patent
Hannes

(10) Patent No.: US 8,325,851 B2
(45) Date of Patent: Dec. 4, 2012

(54) METHOD FOR COMPENSATING SIGNAL DISTORTION IN AN EMITTING PAYLOAD

(75) Inventor: Dirk Hannes, AG Noordwijk (NL)

(73) Assignee: Agence Spatiale Europeene, Paris (FR)

( * ) Notice: Subject to any disclaimer, the term of this patent is extended or adjusted under 35 U.S.C. 154(b) by 114 days.

(21) Appl. No.: 12/864,446

(22) PCT Filed: Jan. 24, 2008

(86) PCT No.: PCT/IB2008/001292
§ 371 (c)(1),
(2), (4) Date: Oct. 27, 2010

(87) PCT Pub. No.: WO2009/093094
PCT Pub. Date: Jul. 30, 2009

(65) Prior Publication Data
US 2011/0033006 A1 Feb. 10, 2011

(51) Int. Cl.
*H04K 1/02* (2006.01)
*H04L 25/03* (2006.01)
*H04L 25/49* (2006.01)

(52) U.S. Cl. ........ 375/297; 375/296; 375/231; 375/232; 375/285; 375/230; 455/501; 455/63.1; 455/570; 455/114.3; 455/114.2

(58) Field of Classification Search .................. 375/297, 375/229–232, 285; 455/501, 63.1, 570, 114.3, 455/114.2
See application file for complete search history.

(56) References Cited

U.S. PATENT DOCUMENTS

| 6,405,147 B1 | 6/2002 | Fera |
| 2005/0195919 A1* | 9/2005 | Cova .......................... 375/297 |
| 2008/0197925 A1 | 8/2008 | Furuta et al. |

FOREIGN PATENT DOCUMENTS

| WO | 98 59471 | 12/1998 |
| WO | 2006 033256 | 3/2006 |

* cited by examiner

*Primary Examiner* — Phuong Phu
(74) *Attorney, Agent, or Firm* — Oblon, Spivak, McClelland, Maier & Neustadt, L.L.P.

(57) ABSTRACT

A method for compensating signal distortion in an emitting payload including determining a compensation transfer function and introducing it within the aggregate response of the payload; choosing an initial tentative compensation transfer function and introducing it within the aggregate response of the payload; acquiring an output signal of the emitting payload; based on the acquired output signal and on a reference signal, corresponding to an expected undistorted output signal, performing an estimation of a residual distortion transfer function of emitting payload; and based on the estimation of the residual distortion transfer function, computing an updated tentative compensation transfer function and introducing it within the aggregate response of the payload. The estimation can be a black-box estimating and the reference signal can be generated on-purpose, and not measured from within the emitting payload.

22 Claims, 11 Drawing Sheets

FIG.3C
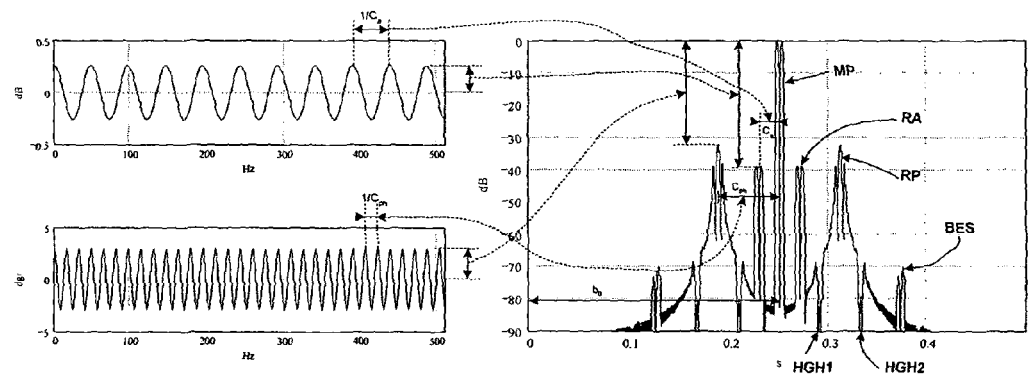
FIG.3D
FIG.3E
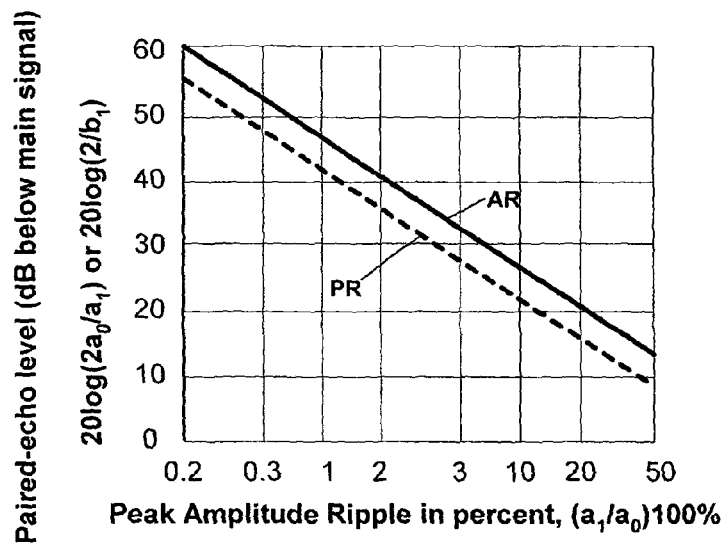
FIG.3F

METHOD FOR COMPENSATING SIGNAL DISTORTION IN AN EMITTING PAYLOAD

The invention relates to a method for compensating signal distortion in an emitting payload by introducing a suitable pre-distortion or compensation transfer function within the aggregate response of said payload.

The method is particularly well-suited to space applications, and more particularly to generative payloads such as navigation payloads.

Pre-distorting signals of a payload in order to compensate for payload-induced linear and/or nonlinear distortion is known in the art of telecommunications. These compensation functions are often contained inside one of the onboard equipments, i.e. a linearizer in an RF high power amplifier, typically providing nonlinear reduction, or an equalizer comprising a tunable filter stage, providing linear response flattening in the frequency domain. See, for example, the paper from Maria-Gabriella Di Benedetto and Paola Madarini "An Application of MMSE Predistortion to OFDM Systems", IEEE Transactions on Communications, Vol. 44, No. 11, November 1996.

Determining a suitable compensation transfer function requires the simultaneous knowledge of an input signal of the payload and of the corresponding output signal. Measuring an input signal, however, is not always expedient, particularly in the case of a generative payload. In fact, generative payloads internally generate their own input signal; accessing said input signal requires the mounting of couplers inside the payload, which adds weight, calibration errors and complexity, and which also generates access constraints in general (e.g. physical intervention by a test engineer, opening/re-closing manipulation of access panels or umbilicals in order to reach the measurement points, mating/de-mating of connectors). An aim of the invention is to provide a method of compensating signal distortion in an emitting payload, without the need of acquiring an input signal of said payload.

Another aim of the invention is to provide a distortion compensation method which is simple to implement and robust against individual payload element (equipment) parameter drifts and tolerances of individual payload elements.

Still another aim of the invention is to provide a flexible distortion compensation method, working with almost any signal modulation constellation and making minimal assumptions on the signal and payload characteristics.

Still another aim of the invention is to provide a distortion compensation method which can be carried out during operation of the payload, without the need of interrupting service.

The method of the invention is particularly well suited for generative payloads, and more particularly for navigation payloads, but it is not limited to this particular field. It can also be applied, for example, to telecommunication payloads for optimizing Inter-Symbol Interference, and to synthetic aperture radar payloads for reducing ranging estimation biases.

According to the invention at least some of these aims can be achieved by a method for compensating signal distortion in an emitting payload, comprising determining a compensation transfer function and introducing it within the aggregate response of said payload, the method being characterized in that it comprises:
 (a) choosing an initial tentative compensation transfer function and applying it to the aggregate response of said payload;
 (b) acquiring an output signal of said emitting payload;
 (c) based on said acquired output signal and on a reference signal, corresponding to an expected undistorted output signal, performing an estimation of a residual distortion transfer function of said emitting payload; and
 (d) based on said estimation of said residual distortion transfer function, computing an updated tentative compensation transfer function.

Preferably, steps (b) to (d) are repeated iteratively until a target condition is met, indicating that a satisfactory compensation of signal distortion has been achieved.

Preferably, the estimation is performed using a "black-box" approach and the reference signal is "artificially" generated, i.e. it is not a signal measured from within the payload.

Advantageous embodiments of the invention are described by the appended dependent claims.

A particularly advantageous feature of the invention is the use of a reference signal which is not measured inside the payload, thus suppressing the need for undesired signal couplers.

Thanks to the use of a black-box estimation technique, there is no need for detailed knowledge of the payload operation, and only minimal assumptions are required. Basically, what is required is that the payload response is temporal time-invariant and memory-less, and the reference signal is time-invariant. This provides the method of the invention with great flexibility.

An interesting feature of the invention is that a linear compensation function can be used for compensating an aggregate distortion including nonlinear contributions.

When applied to spacecraft payloads, the method of the invention can be carried out both on-ground and in-space. In the latter case, it is not necessary to interrupt operation, since the nominal operation output signal can be used for determining the required compensation transfer function.

The invention also relates to an emitting payload comprising means for pre-compensating signal distortion, adapted for carrying out said method.

The invention will now be described in detail with reference to the enclosed drawings, given for illustration only and not intended to be limitative. In the drawings:

FIGS. 3A to 3F illustrates the impact of the distortion transfer function of FIG. 2 on an exemplary input signal;

Figure 5A:
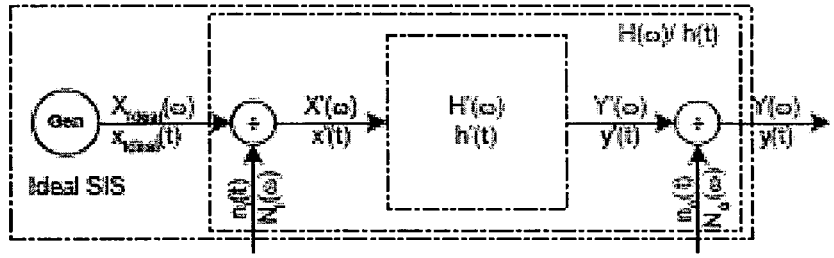
Figure 5B:
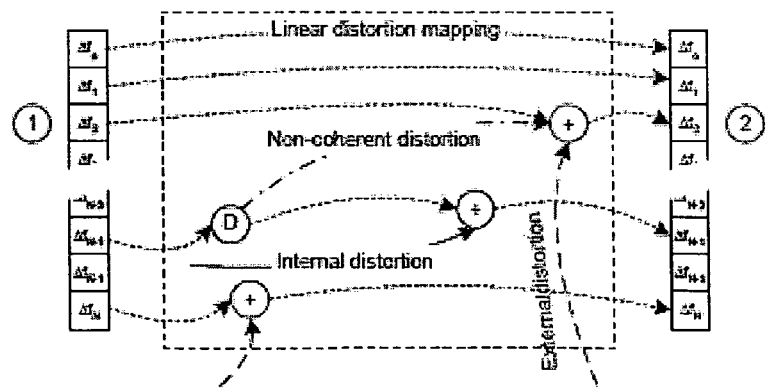
Figure 5C:
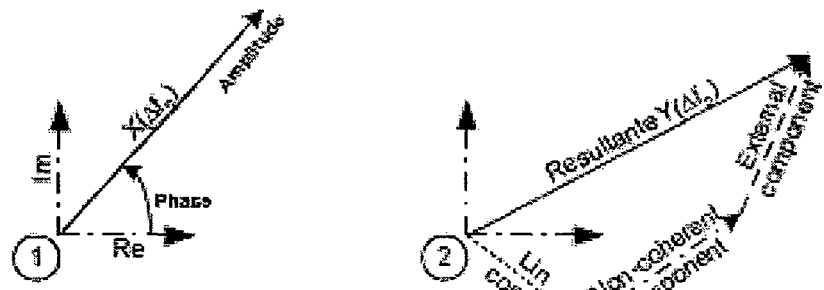
Figure 6:
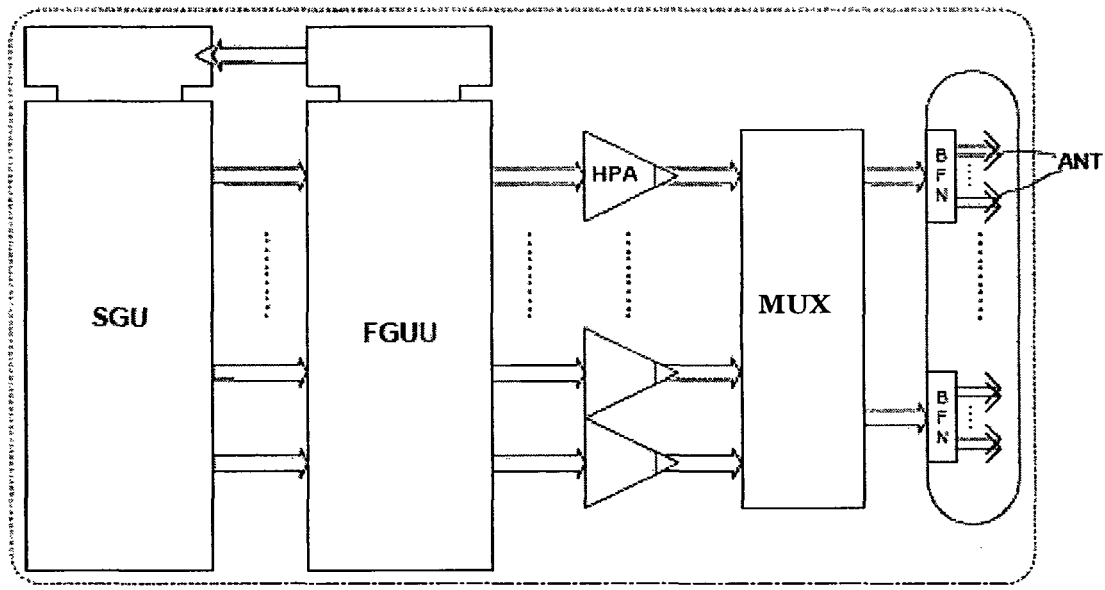
Figure 7:
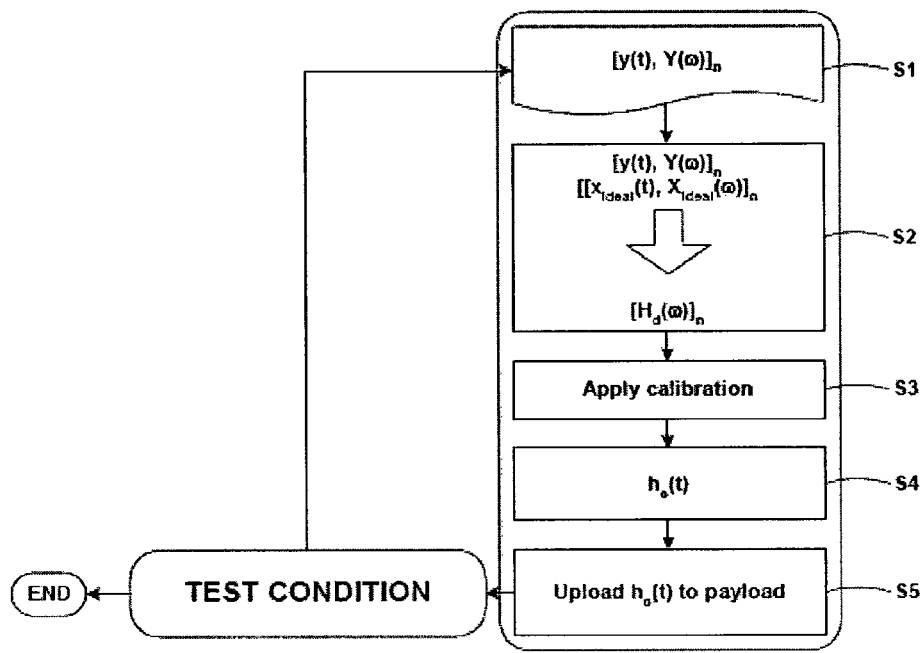
Figure 8:
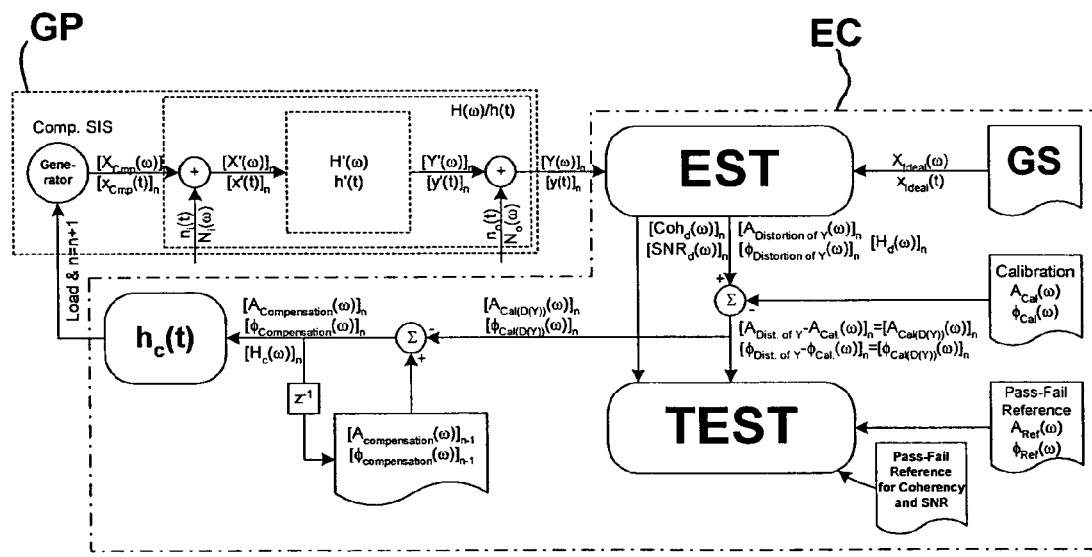
Figure 9:
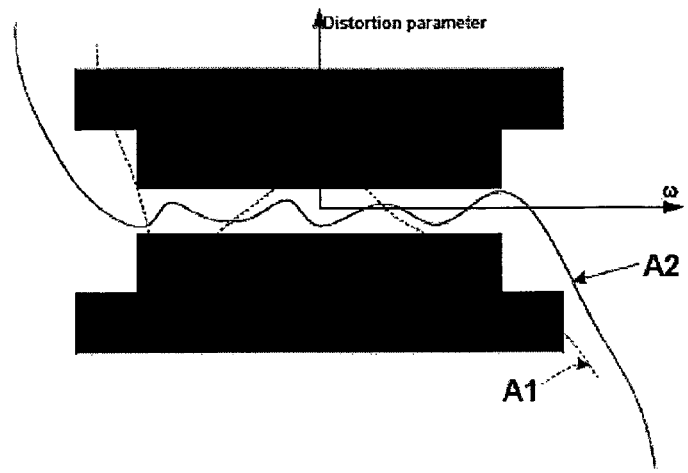
Figure 11:
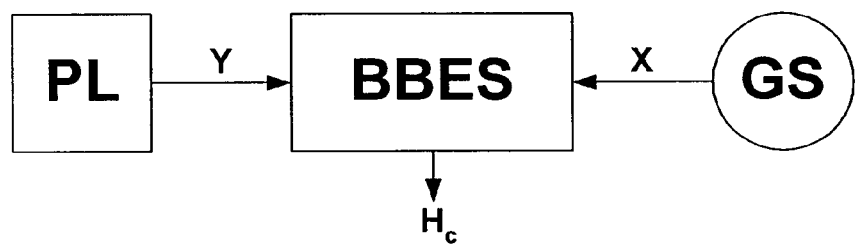

FIGS. 5A to 5C schematically represent the basic mechanisms of aggregate output signal generation;

FIG. 6 shows a simplified block diagram of a generative emission payload;

FIG. 7 shows a high-level flowchart of a method according to an embodiment of the invention;

FIG. 8 shows a detailed block diagram of a method according to an embodiment of the invention;

FIG. 9 schematically represents an example of a target condition according to an embodiment of the invention;

FIGS. 10A to 10E show an exemplary demonstration of compensation iteration with plots of residual amplitude and phase distortion using a method according to the invention;

FIG. 11 illustrates the principle at the basis of the invention;

FIGS. 12A-12F show an example of the practical results of the application of a method according to the invention at a prototype payload.

The development of satellite payloads in general faces three critical phases: a design phase, an assembly, integration and verification (AIV) phase and an operational phase. During these typical phases, the optimization of the Signal-in-Space (SIS) performance accuracy requires a dedicated approach for generative type of payloads such as navigation payloads. The SIS performance accuracy is a major driver for meeting the overall system performance, more specifically the User Equivalent Ranging Error (UERE), an important inherent parameter for navigation applications.

The SIS performance accuracy represents the amount of non-desired aggregate distortion embedded in the SIS.

The list below summarizes the major system level parameters affecting the EURE caused by aggregate imperfections of the SIS (thus excluding the contributions from the transfer path and from the ground, such as coming from a multipath environment):

S-curve Bias (SCB);
Correlation Loss (CL);
Group delay variations (GD);
Code/Carrier (de-)coherency (CCC);
Allan Variance (AV); and
Phase Noise (PN).

It should be noted that translating these system level parameters into design implementation requirements is not straightforward and often requires complex architectural models. In particular S-Curve Bias and Correlation Loss are typically interpreted at navigation receiver level as performance figures of merit, and therefore their translation into payload implementation requirements is not straightforward.

The following list summarizes the typical payload implementation requirements:

Amplitude and Phase Distortion Response H;
Non-Coherent Distortion (NCD), embedded in H on particular conditions;
Group delay (GD), embedded in H as the derivative of phase over frequency;
Code/Carrier Coherency (CCC), embedded in H, as the skewing between phase and group delay;
Allan Variance (AV), stochastic; and
Phase Noise (PN); stochastic.

Figure 1:
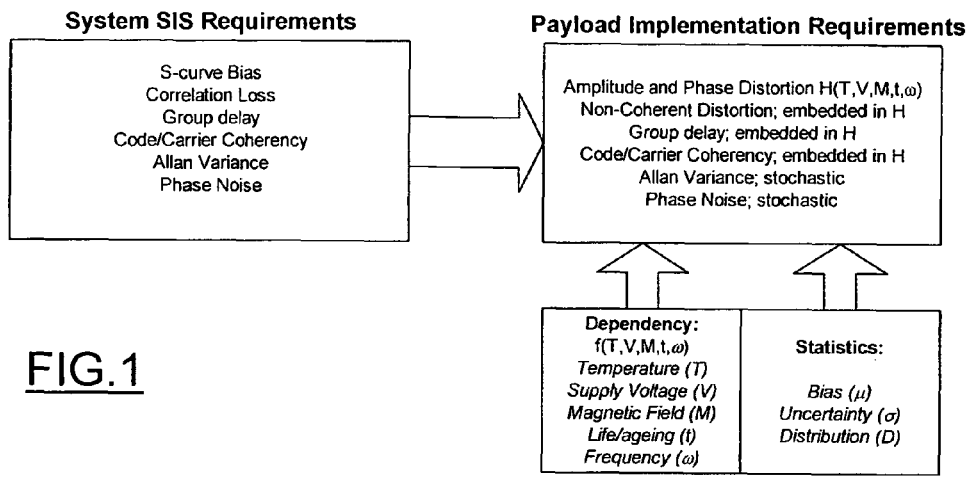
FIG. 1 shows the relation between signal and payload requirements typically used in navigation, communication and radar applications.

This list presents the typical requirements used in the payload design community, either for navigation, communication or radar applications, but particularly tailored to the navigation field in the above-presented case. It should be noted that the derivation process of the element requirements between the various levels (System, Payload, Equipment, Module, Component) is often very complex. This can be due to embedded or hidden relationships which are also difficult to model, or to insufficient modeling accuracy in general. FIG. 1 summarizes the complex relationships between SIS and payload requirements, including the external dependencies down to the level between system and payload. Similar lower level budgets can be generated. It is clear that assessing or configuring the end-to-end upper level performances of a payload is not trivial when composing it from each individual lower level contribution or element.

An important step toward the invention is the remark that, at payload implementation level, most of the deterministic properties are embedded solely in the amplitude and phase distortion response H of the nominal operation output signal. This is true under particular—but not too stringent—conditions, namely time-invariance (at least in the short term, i.e. on the timescale of the procedure for determining the compensation transfer function, and hereafter referred for this purpose 'temporal') and lack of memory of the payload response, and time-invariance of the reference signal. This allows deriving some end-to-end properties from the payload SIS in an "aggregate" way, i.e. without the need to know the hidden and complex lower and upper level relationships and models.

The consideration of the existence of an aggregate property embedded in the SIS and describing the net distortion is an important feature of the invention. It should be noted that the invention, at least in its basic form, only deals with the deterministic and stationary or quasi stationary properties of the SIS. It is assumed that the stochastic components are optimized with other means during the payload design phase as common engineering practice, but their impact can also be reduced by standard averaging concepts at the receive side such as loop phase integration, and the use of pilot channels as a non-exhaustive example list.

The impact of aggregate amplitude and phase distortions embedded into the SIS, caused by the payload transfer response function H, generates the effect of paired-echo distortions as described in "Radar Signals, An Introduction to Theory and Application", Charles E. Cook and Marvin Bernfeld, Artech House, Boston, London, ISBN 0-89006-733-3, Chapter 11: Effects of Distortion on Matched-Filter Signals, pages 371-372, and is here below summarized with a complement of two explanatory examples. The end-to-end payload distortions over frequency can be described by means of the general frequency response function H, which describes both amplitude and phase distortions simultaneously. Let us first consider a simple sinusoidal distortion transfer function whose amplitude and phase component are expressed, as a function of angular frequency ω, by:

$$|H(\omega)| = a_0 + a_1 \cos(C_a \omega)$$

and $$\arg(H(\omega)) = b_0 \omega - b_1 \sin(C_{ph} \omega)$$

Figure 2:
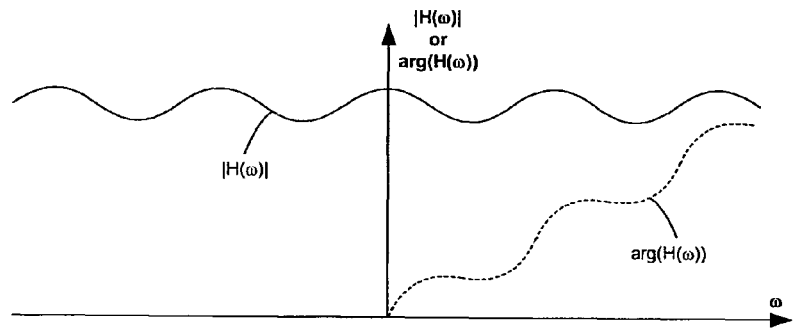
FIG. 2 shows the plots of the amplitude and phase components of a sinusoidal distortion transfer function.

(see FIG. 2).

In general, the composite distorted output signal in time (t) can be approximately described as:

$$s_{out}(t) = a_0 \left\{ s_{in}(t') + \frac{b_1}{2}[s_{in}(t' + C_{ph}) - s_{in}(t' - C_{ph})] + \right. \quad (1)$$
$$\frac{a_1}{2a_0}[s_{in}(t' + C_a) + s_{in}(t' - C_a)] +$$
$$\frac{a_1 b_1}{4a_0}[s_{in}(t' + C_a + C_{ph}) + s_{in}(t' + C_a - C_{ph})] +$$
$$\left. [s_{in}(t' - C_a + C_{ph}) + s_{in}(t' - C_a - C_{ph})] \right\}$$

with:
$s_{out}(t)$=distorted output signal in the time domain;
$s_{in}(t')$=non-distorted input signal in the time domain;
$a_0$, $a_1$=amplitude distortion factors;
$b_0$, $b_1$=phase distortion factors;
$C_a$=amplitude ripple circular frequency over ω;
$C_{ph}$=phase ripple circular frequency over ω; and
$t' = t - b_0$.

It is interesting to note that it is not required to specify the type of the undistorted input signal $s_{in}(t)$, making equation 1 usable for various applications. The amplitude and phase distortions applied on the operation output signal generate shifted replicas of the undistorted signal in the form of paired echoes, similar to what happens in multipath environments generating replicas interfering with the fundamental undistorted signal.

Equation 1 shows that two pairs of paired-echo replicas are generated, each related to the amplitude and phase distortion magnitude respectively. In many cases the last four terms will be negligible (see also FIG. 3E) so only the first five terms need to be considered leading to the following equation:

$$S_{out}(t) \approx a_0 \left\{ s_{in}(t') + \frac{b_1}{2}[s_{in}(t' + C_{ph}) - s_{in}(t' - C_{ph})] + \frac{a_1}{2a_0}[s_{in}(t' + C_a) + s_{in}(t' - C_a)] \right\} \quad (2)$$

Figure 3A:
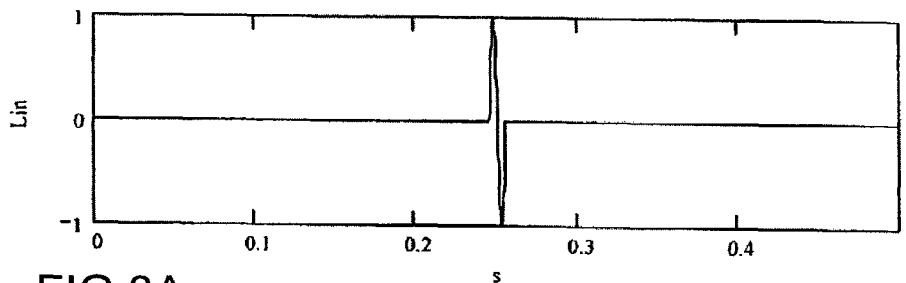
Figure 3B:
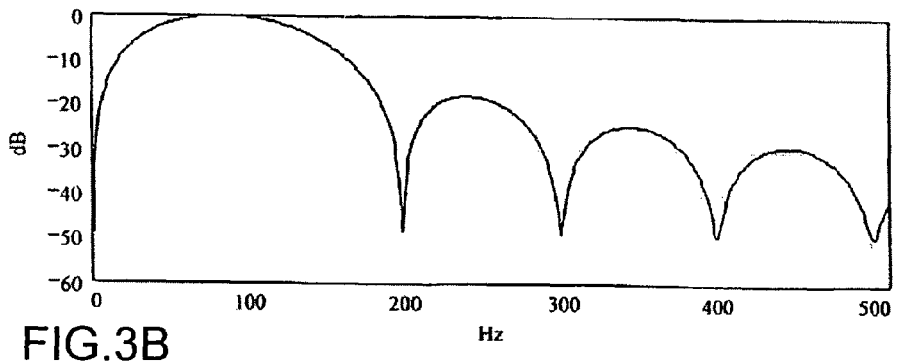

Most interesting is that the time bias in the time domain, either $C_a$ or $C_{ph}$, of the replicas with respect to the fundamental signal is directly related to the ripple circular frequency period in the frequency domain, and that the magnitude of the replicas is related to the amplitude and phase variation magnitude over frequency. This is demonstrated in the FIGS. 3A-3F, wherein:

FIG. 3A represent a single-cycle undistorted signal in time domain;

FIG. 3B, the spectrum of said undistorted signal;

FIGS. 3C and 3D, respectively, the amplitude (logarithmic scale) and phase (linear scale) of a sinusoidal distortion transfer function H in frequency domain;

FIG. 3E, the corresponding distorted signal (logarithmic scale) in time domain; and FIG. 3F, in a logarithmic scale, the amplitude (AR) and phase (PR) ripples expressed as a function of the values $a_0$, $a_1$, $b_1$. Parameter $b_0$ is the average transit time delay of the whole signal, i.e. the slope of a fitted linear reference through zero, equivalent to this transit delay. Only the deviations from said linear reference contribute to distortion.

On FIG. 3E, the main peak MP corresponds to the original, undistorted signal. The first side peak RA is a replica associated to amplitude distortion with relative time-offset ($+C_a$) with respect to MP, while the second side peak RP is due to phase distortion with relative time-offset ($+C_{ph}$). References HGH1 and HGH2 indicate features of the distorted signal associated to the second order components of amplitude and phase distortion related to the terms of equation (1) which were ignored while deriving equation (2), said HGH1 with relative time offset ($-C_a+C_{ph}$) and HGH2 with relative time offset ($+C_a+C_{ph}$), respectively. Reference BES is associated to a second order Bessel component $J_2$ due to the relative high selected phase modulation component $b_1$ with a resulting relative time offset ($+2C_{ph}$).

Since an arbitrary transfer function can be decomposed, according to Fourier theory, in a sum of sinusoidal transfer functions, the distortion mechanism discussed above can be extended to more general distortion transfer functions wherein the theory remains applicable on each individual component:

$$|H(\omega)| = a_0 + \sum_{n=1}^{N} a_n \cos(C_{a_n}\omega + \Phi_{a_n})$$

$$\arg(H(\omega)) = b_0\omega - \sum_{n=1}^{N} b_n \sin(C_{ph_n}\omega + \Phi_{ph_n})$$

One of the fundamental functions in navigation applications is the calculation of the correlation function of the Code Division Multiple Access (CDMA) signals for the positioning determination process. A secondary output function is the calculation of the S-curve (consisting of the time spaced difference between two correlation functions), this in order to increase the position detection sensitivity. Concerning this latter function, asymmetries in the correlation function, caused by the above described mechanism, generate positioning error biases (S-Curve Bias); therefore, limiting the amount of operation output signal distortions is of fundamental importance in order to minimize the positioning biases.

Figure 4A:
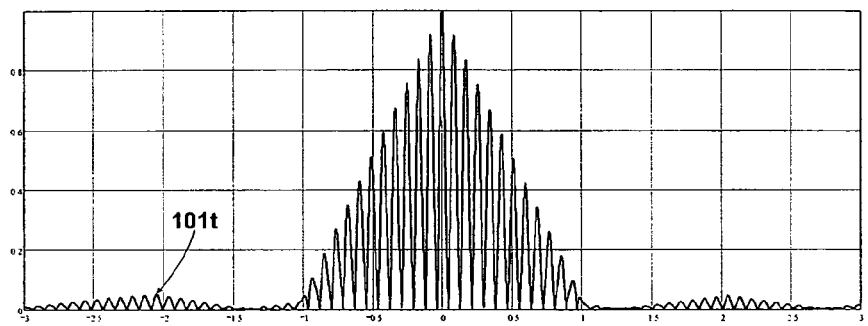
FIGS. 4A to 4E illustrates the impact of distortion on the correlation function of a typical operation output signal, according to a complementary example.
Figure 4A:
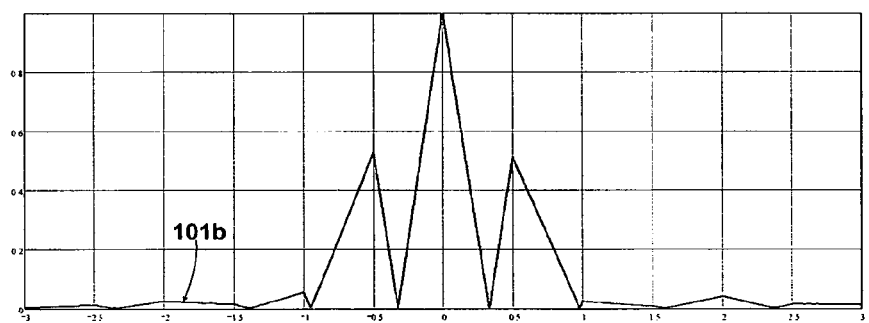
Figure 4B:
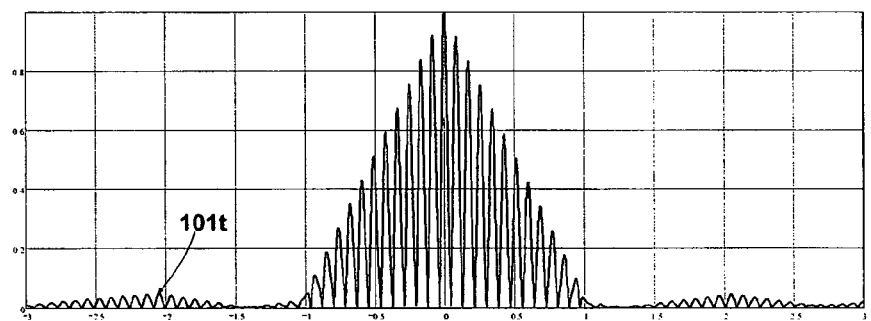
Figure 4B:
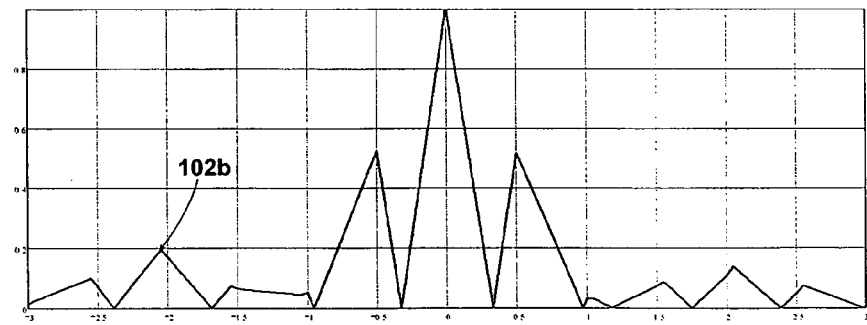
Figure 4C:
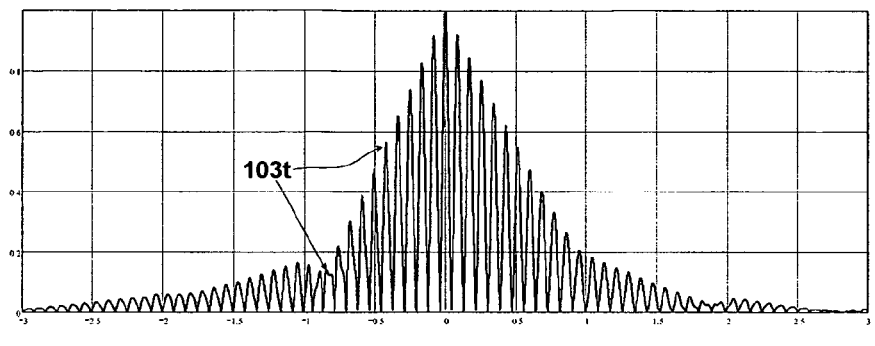
Figure 4C:
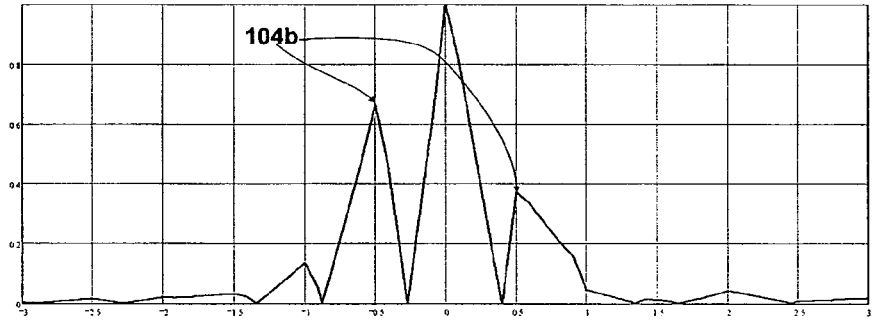
Figure 4D:
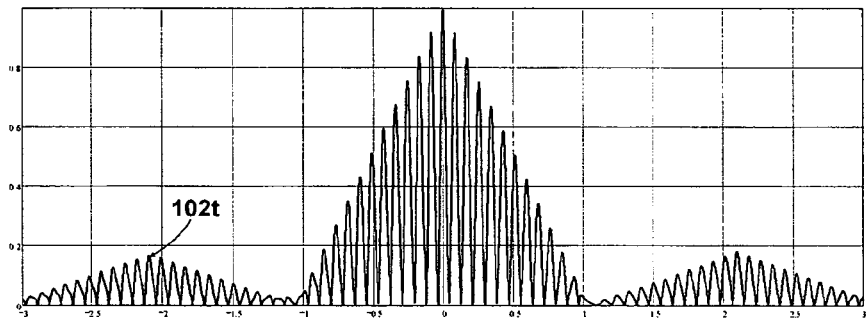
Figure 4D:
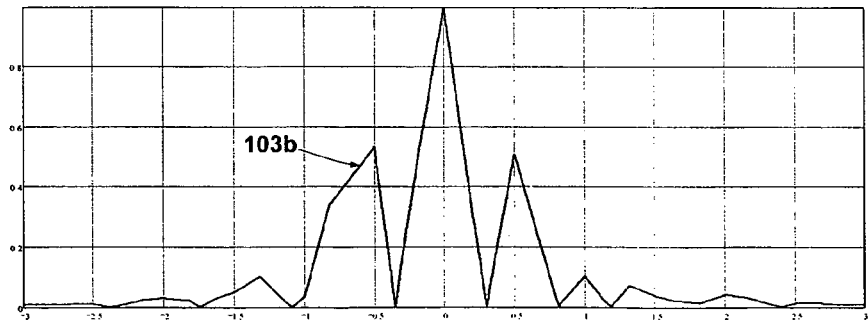
Figure 4E:
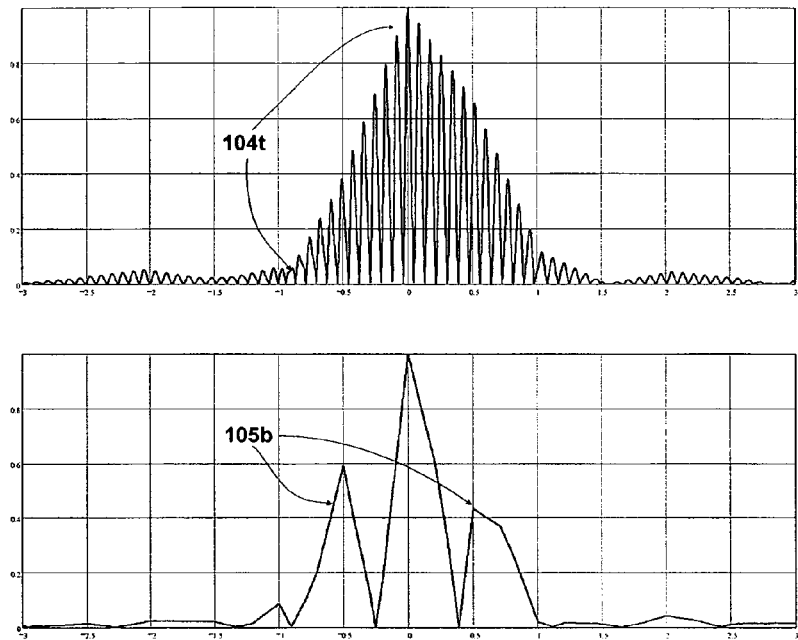

FIGS. 4A to 4E illustrates the negative impact of distortion on the symmetry of the correlation function of a typical output signal of an emitting navigation payload, according to a complementary example. The example is based on a composite signal combining sub-components of type BOC($x_n,y_n$) with BOC=Binary Offset Coding, x=sub-carrier offset frequency in MHz, y=code rate in MChips. The example is configured as {$x_1$=15×1.023 MHz, $y_1$=2.5×1.023 MHz, cosine sub-carrier}, for short BOC(15,2.5)–c, and {$x_2$=1×1.023 MHz, $y_1$=1×1.023 MHz, sine sub-carrier} for short BOC(1,1)–s. The figures illustrate the following:

FIG. 4A show a BOC(15,2.5)–c (top) and BOC(1,1)–s (bottom) undistorted correlation function;

FIG. 4B show a BOC(15,2.5)–c (top) and BOC(1,1)–s (bottom) distorted correlation function with $a_0/a_1$=0, $C_a$=N/A, $b_1$=20 deg, $C_{ph}$=2000 ns;

FIG. 4C show a BOC(15,2.5)–c (top) and BOC(1,1)–s (bottom) distorted correlation function with $a_0/a_1$=0, $C_a$=N/A, $b_1$=20 deg, $C_{ph}$=800 ns;

FIG. 4D show a BOC(15,2.5)–c (top) and BOC(1,1)–s (bottom) distorted correlation function with $a_0/a_1$=0, $C_a$=N/A, $b_1$=20 deg, $C_{ph}$=400 ns; and FIG. 4E show a BOC(15,2.5)–c (top) and BOC(1,1)–s (bottom) distorted correlation function with $a_0/a_1$=0, $C_a$=N/A, $b_1$=20 deg, $C_{ph}$=200 ns.

Only a phase distortion in this case was applied and $b_1$ was taken relatively high in order to amplify the effect for demonstrative reasons. It can be seen that the undistorted correlation functions of FIG. 4A are symmetric, while in FIGS. 4B-4E phase distortion introduce asymmetries.

In the plots of FIGS. 4A and 4B, the horizontal axis represents the normalized time versus the chip rate. The unit is 391 ns for the top panels and 997.5 ns for the bottom ones. The scale of the vertical axis is linear.

Reference 101$t$ of FIG. 4A—top panel represents a side lobe associated to code cross-correlation products for the BOC(15,2.5)–c. Since no distortion is present, the correlation traces are symmetric in window [−1,+1] of the x-axis. The same feature for the BOC(1,1)–s signal is identified by reference 101$b$.

For the BOC(1,1)–s signal in the bottom panel of FIG. 4B, reference 102$b$ represents a correlation peak due to a distortion-induced first-order replica. As the phase ripple circular frequency $C_{ph}$ decreases, the replica begins interfering with the original correlation function in window [−1,+1] of the x-axis and introduces strong asymmetries in the envelope correlation trace (reference 103$b$ on the bottom panel of FIG. 4C). Asymmetries are even stronger in FIGS. 4D (reference 104$b$) and 4E (reference 105$b$).

Distortion has the same effect for the BOC(15,2.5)–c signal. Replica appears in FIG. 4C (reference 102$t$) and start interfering with the original signal, introducing asymmetries in the envelope correlation trace, on FIGS. 4D (reference 103$t$) and 4E (reference 104$t$).

It should be noted that phase distortion in general is the major cause of asymmetries as the replicas translated into the time domain are phase asymmetric in that domain. Amplitude distortions will also contribute to asymmetry when non-linearities are involved, generating cross-coupling between amplitude and phase domain (i.e. amplitude variations introduce phase variations).

The distortion introduced by an emitting payload includes a linear and a nonlinear component, the latter being essentially due to the high-power radio-frequency amplifiers HPA (see FIG. 6). According to the invention, the impact of said nonlinear effects is included in an "aggregate" distortion, and considered not to be distinguishable from that of linear effects. In other words, the aggregate distortion transfer function (in this case materialized by the aggregate SIS distortion) can be interpreted as the signal energy transfer process that maps over the same frequency bins from input to output, without distinguishing between components of linear, nonlinear or even external origin. The main reason for this is that it is rather difficult to model nonlinear and other non-coherent processes, especially at design but also at verification level. However, it has been found that, as long as distortion transfer function H can be considered to be temporal time-invariant and memory-less and the input signal X time-invariant, this simplification does not affect the signal output aggregate performance within the time-invariant period.

As a consequence of this approach, linear and nonlinear distortion processes can be approximately modeled by a linear and time invariant net equivalent distortion transfer function, and their impact can be compensated for by introducing an adequate compensation transfer function with the goal of reducing the net distortion.

Time-invariance of H can be optimized during the design process by reduction of environmental dependency for the parameters as presented in FIG. 1. When long-term time-invariance of H cannot be achieved, but time-variance properties can be characterized and tracked over time, it can be compensated as part of the overall compensation algorithm by the introduction of regular update cycles within the time-variant period. Time-invariance of X, can be assumed for the CDMA signals typically used i.e. for navigation generative payloads when defined over the code period, taken a fixed code chip rate, and (if applicable) subcarrier rate. Memory effects of H can be controlled by proper RF high power amplifier design measures, i.e. adequate isolation of DC bias circuits with respect to RF.

The basic concept is that distortion related to nonlinear processes, or of external origin, generates non-coherent output distortion with respect to the input relevant frequency bin. Otherwise stated, a nonlinear process typically transfers input energy from one particular frequency bin $\Delta f_x$ to a different one (also known as spectral regrowth). In-Band Undesired Spurious (IBUS) can be treated in a similar way while assessing its impact (for instance considering it as an external component $N_0(\omega)$).

FIG. 5A shows a block diagram of a model of a generative emitting payload. A signal generator Gen generates an ideal SIS $X_{ideal}(t)/X_{ideal}(W)$ to which an external distortion component $n_i(t)/N_i(\omega)$, when applicable, is added. External distortion component $n_i(t)/N_i(\omega)$ can include noise, but also deterministic contributions (e.g. a CW interference) which, unlike Gaussian noise, cannot be simply integrated away by standard integration, and have therefore to be taken into account when determining the compensation transfer function. The signal $x'(t)/X'(\omega)$, already affected by said external distortion, is then subject to an internal (linear and nonlinear) distortion process modeled by transfer function $h'(t)/H'(\omega)$. Addition of a supplementary external distortion component $n_0(t)/N_0(\omega)$, when applicable, yields the final, distorted SIS $y(t)/Y(\omega)$. The overall distortion transfer function $H(\omega)$ is defined as $Y(\omega)/X_{ideal}(\omega)$, h(t) being the corresponding impulsive response (for the sake of simplicity, from now on $X_{ideal}$ will simply be noted as X). FIG. 5B represents the internal, but unknown in principle, mapping between frequency bins of the ideal and of the distorted SIS. Node '+' represents a summation of internal signals, node 'D' represents a weighted division or split of internal signals, with a overall layout according to an unknown structural model. FIG. 5C shows an exemplary vector diagram for frequency bin $\Delta f_2$.

It should be noted that the distortion transfer function H depends on the point at which the nominal operation output signal is probed.

FIG. 6 represents a generative emitting payload typically for space applications comprising a Signal Generation Unit SGU, a Frequency Generation and Upconversion Unit FGUU, an High-Power RF Amplification Module HPA, an output multiplexer MUX and a number of emitting antennas ANT, with the associated beamforming networks BFN, if applicable. In this case, the aggregate distortion response transfer function to be compensated includes all contributions from SGU to ANT, or alternatively up to before the ANT for less complex payload implementation configurations. This implies onboard measurement capability of the nominal operation output signal.

An alternative possibility is to measure the output signal on ground. In this case, the distortion introduced by the transfer path needs to be calibrated out, in order to be able to compensate the distortion part of H related to payload only. Typical transfer path parameters to be accounted are ionospherical propagation delay (translated to equivalent phase) and path loss gain variation over frequency.

A complementary useful parameter for estimating the signal distortion quality is the Coherence Function, quantifying the causal relationship between the system output (Y) and its input (X), regardless of the causes of said relationship. The Coherence Function is equal to the squared magnitude of the Cross Power Spectrum of signals X and Y, divided by both Auto Power Spectra of X and Y, and can vary from zero to one:

$$\gamma^2(\omega) = \frac{|G_{YX}(\omega)|^2}{G_{XX}(\omega)G_{YY}(\omega)} \quad (3)$$

A value of 1 of the Coherency Function $\gamma^2(\Delta f_x)$ indicates perfect correlation of signal energy between frequency bins $\Delta f_{x\,in}$ and $\Delta f_{t\,out}$, i.e. a perfectly causal relationship between X and Y at frequency bin $\Delta f_x$; deviations from 1 are due to non-coherent and external distortions, and a value of 0 indicates that there is only uncorrelated noise in the output frequency bin $\Delta f_{x\,out}$.

A non-exhaustive list of phenomena suitable to cause a deviation from 1 of the Coherency Function is given below:

Contamination by internal non-correlated noise or signals (e.g. spurious oscillations);

Contamination by external noise or signals;

Non-linearities transferring energy from one frequency bin to another;

Additional system inputs; and

Internal system leakages.

The Coherency Function also allows calculating the Signal-to-Noise ratio of the output signal Y:

$$SNR(\omega) = \frac{\gamma^2(\omega)}{1 - \gamma^2(\omega)} \quad (4)$$

The normalized noise level is given by:

$$\text{Noise}(\omega) = (1 - \gamma^2(\omega))G_{YY}(\omega) \quad (5)$$

After having discussed the relevant distortion mechanisms, a compensation method according to the invention will now be described. In particular, the case of a generative payload for satellite applications (see FIG. 6) will be considered; however, the method of the invention can be applied to any emitting payload.

As represented on FIG. 11, the principle at the hearth of the invention is to estimate the end-to-end internal response of an emitting payload PL by the use of an estimator BBES receiving at its inputs the output signal Y of the payload and a <<Golden Standard>> X, i.e. a reference signal corresponding to an expected undistorted output signal, not based on measurements. The reference signal is generated by an external bloc designated by reference GS on the figure. Advantageously, X can be time-aligned with respect to the output signal Y in order to reduce $b_0$ as much as possible. This is by no means essential, but can accelerate the convergence of the estimator.

Preferably, the estimator BBES is of the "black-box" type, using no a priori knowledge of the payload induced distortion.

Here, "end-to-end" means that all the distortions introduced by the whole payload equipment chain (or by a relevant part thereof) are simultaneously taken into account including nonlinear and/or incoherent contributions. Therefore, all the individual payload equipment performances, within perimeter as shown in FIG. 6 by the dashed line, contribute in a correlated way to the aggregate output signal performance, as occurring during nominal operation. Adverse interface effects between different equipments of the payload, such as RF mismatch effects, are also automatically taken into account with this method of the invention. Moreover, in case required, the Golden Standard can also provide a highly accurate and absolute time stamping reference frame, particularly when triggered by a highly accurate atomic clock. This is useful for longer-term drift characterization of H, which is considered temporal time-invariant according to the invention, and for estimating the "time-invariant" period from the long-term characterization of the acquired data.

According to a preferred embodiment of the invention, the Frequency Response Transfer Function (FRTF) of the aggregate distortion is calculated with a standard Cross-Spectrum Estimator, by calculating the output-input signal ratio as shown in the following equation:

$$H(\omega) = \frac{Y(\omega)}{X(\omega)} = \frac{G_{YX}(\omega)}{G_{XX}(\omega)} \quad (6)$$

where $X(\omega)$ is the reference signal, or "Golden Standard", in the frequency domain, $Y(\omega)$ is the measured output signal, also in the frequency domain, while $G_{XY}(\omega)$ and $G_{XX}(\omega)$ are the averaged cross- and auto-power spectra respectively, the latter being used as a normalization factor (here with continuous time representation).

In the time domain, $G_{XY}(\omega)$ and $G_{XX}(\omega)$ can be computed as $$G_{YX}(\omega) = \mathcal{F}(R_{YX}(t)) = \mathcal{F}\left(\int_{-\infty}^{+\infty} y(\tau)x(t+\tau)d\tau\right) \quad (7)$$

$$G_{XX}(\omega) = \mathcal{F}(R_{XX}(t)) = \mathcal{F}\left(\int_{-\infty}^{+\infty} x(\tau)x(t+\tau)d\tau\right)$$

$\mathcal{F}$ being the Fourier-transform operator.

In the frequency domain, $G_{YX}(\omega)$ and $G_{XX}(\omega)$ can be calculated as (here with discrete frequency representation):

$$G_{YX}(\omega) = \frac{1}{m}\sum_{k=1}^{m} Y_k(\omega)\overline{X_k(\omega)} \quad (8)$$

$$G_{XX}(\omega) = \frac{1}{m}\sum_{k=1}^{m} X_k(\omega)\overline{X_k(\omega)}$$

m being length of discrete data sets used.

The final amplitude and phase characteristics are easily derived as:

$$A(\omega) = |H(\omega)|$$

$$\phi(\omega) = \arg(H(\omega)) \quad (9)$$

As discussed above, $A(\omega)$ and $\phi(\omega)$ also take into account incoherent and nonlinear contributions to the aggregate distortion (see FIGS. 5A and 5B).

According to the invention, the emitting payload is considered as a black box, the nominal operation output signal being used for estimating a residual output signal distortion. In the example considered here, relating to the generative payload of FIG. 6, a compensation capability is implemented inside the Signal Generation Unit, which is able to generate the ideal (Golden Standard) reference signal plus an overlay compensation transfer function $H_c$ as its nominal output signal. As discussed above, this "nominal" output signal does not correspond to any "real" signal within the payload, because the SGU itself contributes to the payload aggregate distortion, and this contribution is also taken into account by the compensation method of the invention.

As it will be apparent for the person skilled in the art, the compensation transfer function $H_c$ can be implemented in several different ways. The choice of a particular implementation depends, among other, on the required level of residual aggregate distortion and on the type of aggregated distortion to be compensated for. In most cases a standard digital Finite Impulse Response (FIR) filter, only introducing linear compensation, will be sufficient to achieve the residual aggregate distortion targets. Full asymmetric control over both amplitude and phase domains are typically achieved by mathematical complex (I&Q) topologies. It is a noteworthy feature of the invention that compensation of nonlinear and/or incoherent distortion besides the linear can be included simultaneously, and over frequency, by introducing a purely linear compensation transfer function by considering them as aggregate contributor elements in the net equivalent output signal distortion transfer function.

For implementing said linear compensation transfer function, FIR filters are particularly preferred, but infinite impulse response (IIR) filters can also be used.

It should be understood that the compensation transfer function can also be implemented at different locations within the emitting payload, and not necessarily inside the SGU. The latter, however, is a very natural choice for generative payloads implying low power control, this in contrast to Feed Forward compensation schemes which typically requires additional high power elements.

As no payload internal architectural information is used (black-box approach), in most cases an iterative approach will be required in order to achieve a satisfactory compensation of signal distortion over frequency. This is mainly due to the non-coherent and nonlinear distortion mechanisms which may generate non-monotonous convergence trajectories when an error cost-function is used as a convergence criterion. However monotonous convergence is most often achieved when no memory effects of H are involved. Particularly when nonlinear distortion is heavy, it may be advantageous to include a nonlinear pre-distortion block within the payload, as well known in the prior art (e.g. a gain expansion stage for correcting the gain compression introduced by the HPAs). Reducing the nonlinear distortion contribution is not mandatory according to the invention, but can accelerate the convergence of the iterative procedure for determining $H_c$.

FIG. 7 represents a high-level algorithm of a method according to the invention.

The first step S1 of the method is to measure the nominal operation output signal of the emitting payload, $[Y(\omega)]_n/[y(t)]_n$ (the index "n" refers to the n-th iteration of the algorithm; at the first iteration, n=1). This output signal corresponds to the "nominal" output signal of the SGU, affected by the aggregate payload distortion. In turn, the "nominal" output of the SGU is equal to an ideal output signal to which is applied an initial tentative compensation transfer function $[H_c(\omega)]_1$. At the beginning of the algorithm, said initial tentative compensation transfer function can be taken identically equal to one: $[H_c(\omega)]_1 = 1 \: \forall \omega$.

Then (S2) the aggregate amplitude and phase distortion responses, $[A(\omega)]_n$ and $[\phi(\omega)]_n$, are calculated by performing a black-box estimation, preferably according to the cross-spectrum method of equations 6-9. The "Golden Standard" or reference signal $X_{ideal}(\omega)/x_{ideal}(t)$, known a priori, is used together with the measured output signal $[Y(\omega)]_n/[y(t)]_n$ for performing the estimation. The residual aggregate distortion response of the operation output signal at the n-th iteration of the algorithm is noted $[H_d(\omega)]_n$ in the frequency domain and $[h_d(t)]_n$ in the time domain.

After an optional calibration step S3 for taking into account the uncertainty budget affecting the determination of the residual aggregate response, $[H_d(\omega)]_n$ is used for computing an updated tentative compensation transfer function $[H_c(\omega)]_{n+1}$ (S4); for example, $[H_c(\omega)]_2$ is obtained at the end of the first iteration. This updated tentative compensation transfer function is uploaded to the SGU of the payload, and used for generating the next output signal $[Y(\omega)]_{n+1}/[y(t)]_{n+1}$ (S5).

The method steps described above are repeated iteratively until a target condition is met, indicating that a satisfactory compensation of signal distortion has been achieved. A typical target condition is to get the amplitude and phase frequency response functions approximately flat within an operational bandwidth (equalization). An alternative of a convergence pass-fail criterion can consist in defining a boundary error envelope box over the operational frequency band (or beyond, in order to maintain out-of-band emission requirements) for both amplitude and phase domains to within the residual distortion parameters need to remain. This is illustrated on FIG. 9, wherein curve A1 and A2 respectively represent a non-compliant and a compliant distortion parameter response $[A(\omega)]_n$ (amplitude component) or $[\phi(\omega)]_n$ (phase component).

As time progresses during operation, parameter drifts in the payload will reduce the effectiveness of the compensation, and signal distortion will grow to an unacceptable level again. A new cycle of iteration will fix this degradation of the performances of the payload, without any need for characterizing the drift rate and/or identifying its causes.

FIG. 8 present the algorithm in more detail in the form of a block diagram, wherein block GP represents the generative payload (see FIG. 5A) and EC the estimation/compensation algorithm.

Within the EC block, EST represents the black-box cross spectrum estimator, receiving as inputs the measured output signal of the payload, $[Y(\omega)]_n/[y(t)]_n$, and the artificially generated reference signal or "Golden Standard" $X(\omega)/x(t)$. The EST block outputs the estimated residual aggregate response, $[H_d(\omega)]_n$, decomposed in its amplitude $[A(\omega)]_n$ and phase $[\phi(\omega)]_n$ components; optionally, it also yields an estimation of the coherency function $[\gamma^2(\omega)]_n$ and of the signal-to-noise ratio $[SNR(\omega)]_n$.

The estimated residual aggregate response, $[H_d(\omega)]_n$ is divided by a predetermined calibration transfer function $H_{cal}(\omega) = A_{cal}(\omega) \cdot \exp\{i\phi_{cal}(\omega)\}$. On the figure, the division operation is represented as a subtraction because the amplitude components are typically expressed in logarithmic units. As discussed above, the calibration transfer function represents the uncertainty budged affecting the determination of the residual aggregate response.

The (calibrated) residual aggregate response, $[H'_d(\omega)]_n$ serves as input for a TEST block, checking a target condition. In its simplest form, this condition can consist of a cost-function error value defined by a least-square estimator $f_{LSE}$:

$$e = f_{LSE}(|X(\omega) - Y(\omega)|) \leq e_{target} \quad (10)$$

More complex estimators with better convergence properties and/or other types of criteria, such as the previous mentioned boundary error envelope box, can also be used. The boundary error envelope box criterion is particularly useful when the amplitude of the biasing replicas (according to previous described mechanisms) need to be controlled in a quantified way. Other means are the optional use of the coherency and SNR functions. This is also represented on FIG. 8. One method consists in defining for these two functions similar type of convergence targets as described for the standard amplitude and phase residual parameters. Another method consists in using them as independent convergence performance indicators only. The overall optimization of convergence performance, and selection of optimization topology, is typically defined case-by-case based on design simulations.

The next step of the method consists in updating the tentative compensation transfer function applied by the SGU of the payload. According to the exemplary implementation represented on FIG. 8, this step is performed by dividing the current compensation transfer function $[H_c(\omega)]_n$ by the current residual distortion (after calibration) $[H'_d(\omega)]_n$. Like for the calibration step, use of logarithmic units for the amplitude components of the transfer function allows representing the division by a subtraction operation. On the block diagram, $z^{-1}$ represents a quantized time-delay operator, as usual in the art. The location of the overall algorithm EC and storage of the artificially generated reference signal GS can be implemented anywhere onboard (including emitting payload), and/or on ground. Storage of GS is typically done by the use of look-up tables, which can be alternatively dynamically updated in case required.

If the compensation capability of the SGU is implemented by a FIR digital filter, a further step of the method comprises determining the time-domain FIR coefficients $[h_c(t)]_n$ and uploading them to the payload GP. This results in a new output signal $[Y(\omega)]_{n+1}$ with a reduced residual distortion content. The complete cycle is repeated until convergence is reached, i.e. until the target condition is satisfied.

Several options are possible in order to close the overall loop. The first configuration consists in closing the loop outside the satellite and measuring the residual distortion in a ground station or test facility during the AIV phase. In that case, estimation and compensation will include the distortion introduced by the transfer path and by the ground station or measurement equipment, both for amplitude and phase, over the operational frequency band which is not a trivial task. The second option consists in closing the measurement loop onboard the satellite. The values can be either down-linked in case the algorithm is implemented on ground, or directly used onboard in case the algorithm is implemented onboard. A hybrid solution is also possible. It should be noted that all error factors outside the loop control are to be calibrated out, as common engineering practice.

It should be noted that, while determining the compensation transfer function, computing accuracy is typically affected: by the number of bits fixing the signal quantization grid; if a FIR filter is used, by the digital length thereof; by the length of the sampled input data sets; by the overall processing sampling period, and by payload operating point constraints fixing the dynamic compensation range. The definition and optimization of these various parameters is part of the overall design process.

As the invention is also based on using the nominal operational signals, discontinuities typically occur around signal nulls within the residual distortion response function. This is typically caused by the spectral regrowth energy from any non-linear process within the payload chain, saying mainly RF high power amplifier, which fill up the signal null gaps of the original undistorted signal (non-coherent energy spreading). The discontinuities as such are caused by the alternating phase of the original signal (side)-lobes which are interfering with the spread energy. This is illustrated on FIGS. 10A to 10E showing a practical example of a residual distortion function with discontinuities around the signal nulls for the amplitude and phase domain. This example is also used to demonstrate a compensation iteration sequence using the method of the invention with the following settings: signal sub-component composition=BOC(10,5)–c and BOC(0,5) (the latter equivalent with BPSK(5)) according to definitions as described for FIG. 4; operating point non-linear element=1 dB output back off; and arbitrarily chosen filter bandwidth before non-linear element=40 MHz, this in order to generate envelope variation of input signal to non-linear element. Active compensation ($A_c(\omega)$, $\phi_c(\omega)$) means current compensation applied for the actual observed residual distortion ($A_d(\omega)$, $\phi_d(\omega)$).

Figure 10A:
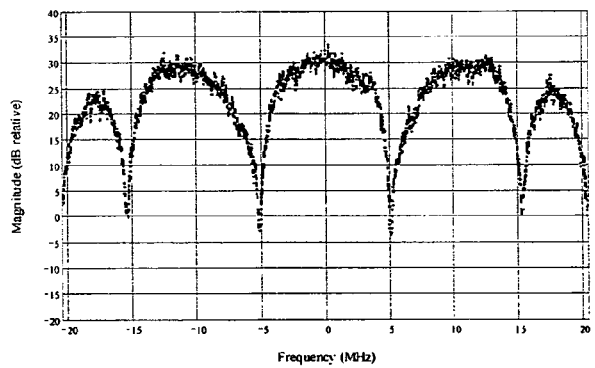
Figure 10B:
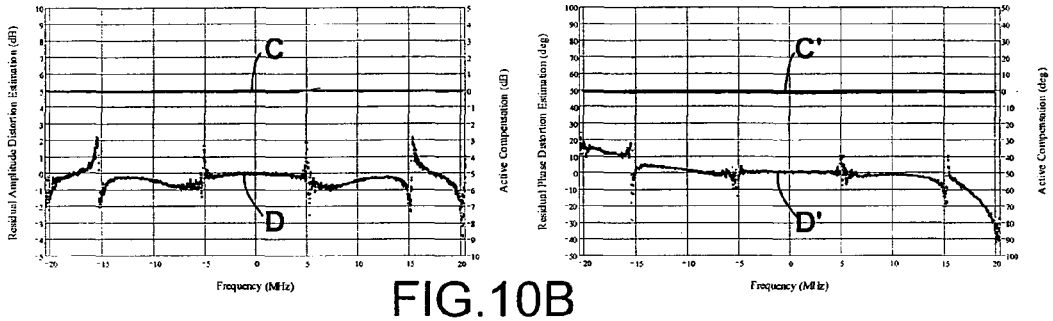
Figure 10C:
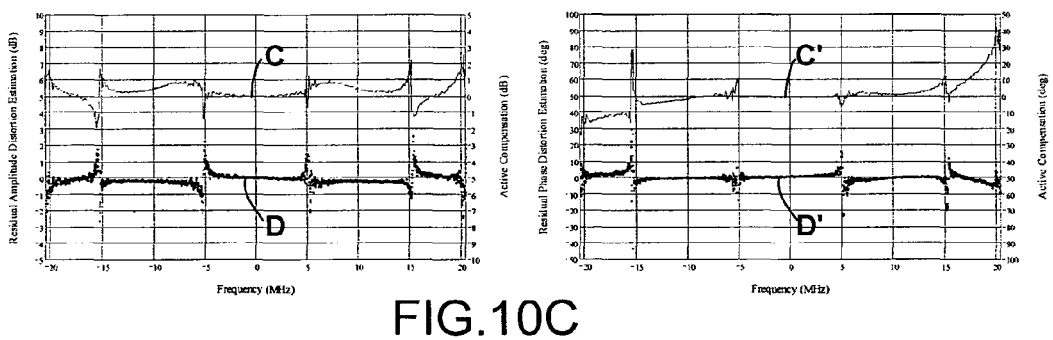
Figure 10D:
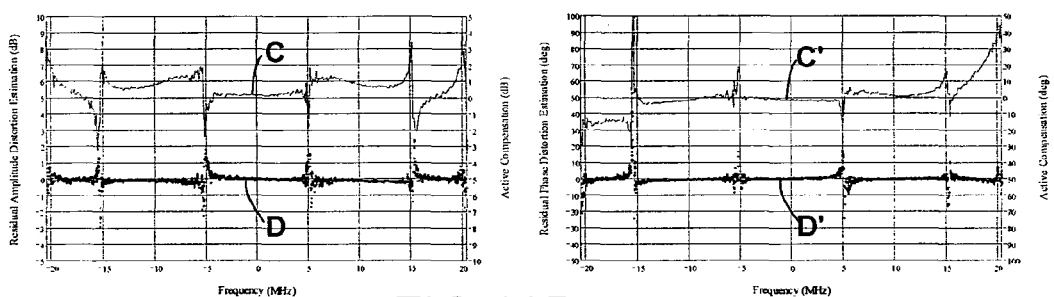
Figure 10E:
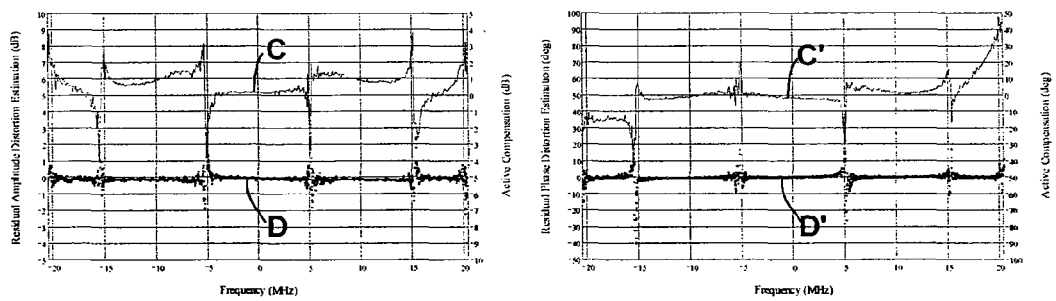

The figures illustrate the following:
FIG. 10A: spectrum of the undistorted output signal showing signal nulls;
FIG. 10B: residual distortion and current active compensation transfer function (left panel: amplitude; right panel: phase) of the uncompensated payload, active compensation equal to 0 dB (amplitude) and 0° (phase), i.e. $H_c(\omega)=1$;
FIG. 10C: residual distortion and current active compensation transfer function (left panel: amplitude; right panel: phase) after the $1^{st}$ iteration, active compensation equal to the inverse of the uncompensated residual distortion;
FIG. 10D: residual distortion and current active compensation transfer function (left panel: amplitude; right panel: phase) after the $2^{nd}$ iteration, active compensation equal previous compensation with updated additional value; and
FIG. 10E: residual distortion and current active compensation transfer function (left panel: amplitude; right panel: phase) after the $3^{rd}$ iteration;

On each of FIGS. 10B to 10E, curves D, D' represent the residual distortion (amplitude and phase, respectively) and curves C, C' the amplitude and phase components of the tentative compensation transfer function of the current active compensation function. The curves are offset for clarity: the y-axis scale for curves D, D' is on the left of each plot, that for curves C, C' on the right axis.

This example also gives an idea of the typical number of iterations required in order to achieve convergence. It can be seen that the main improvement in the response of the compensated payload comes from the first two iteration; further iterations mainly improve the response flatness around the signal nulls (barely visible on FIG. 10E).

Figure 12A:
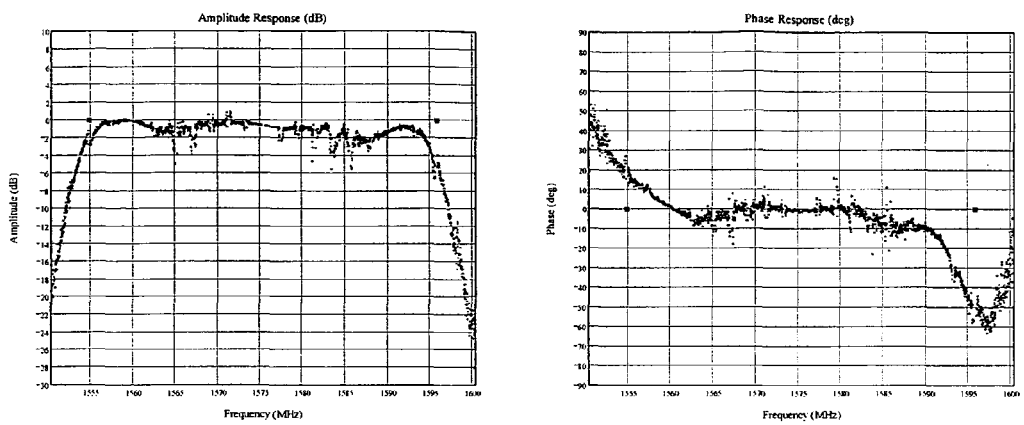
Figure 12B:
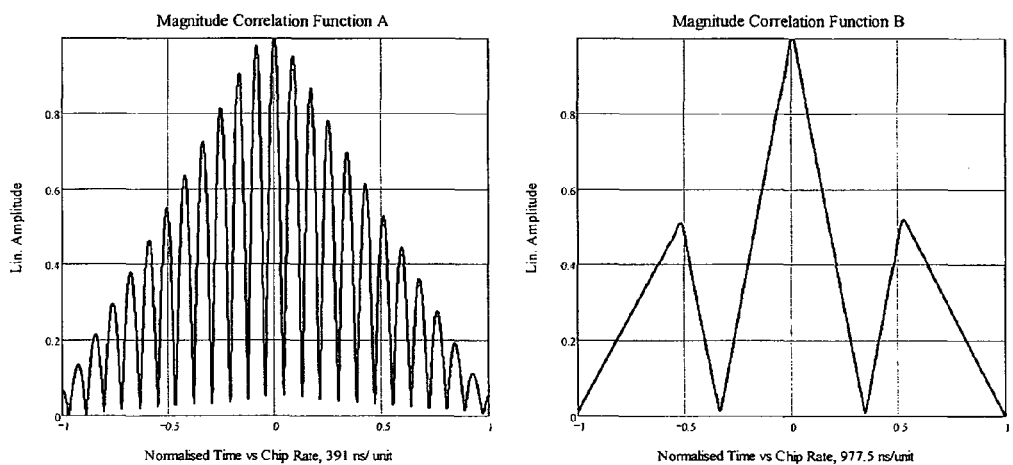
Figure 12C:
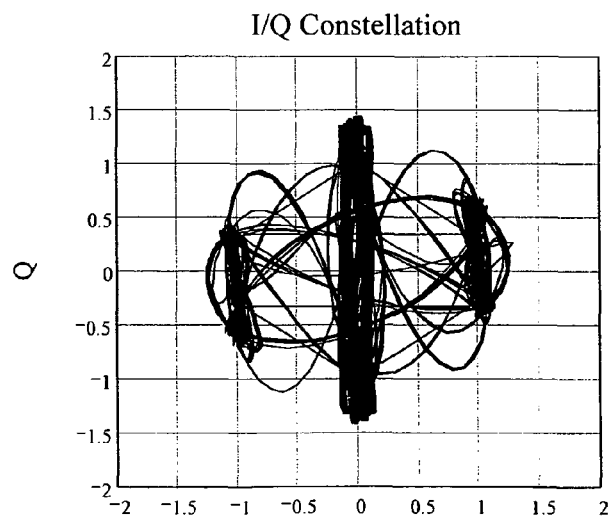
Figure 12D:
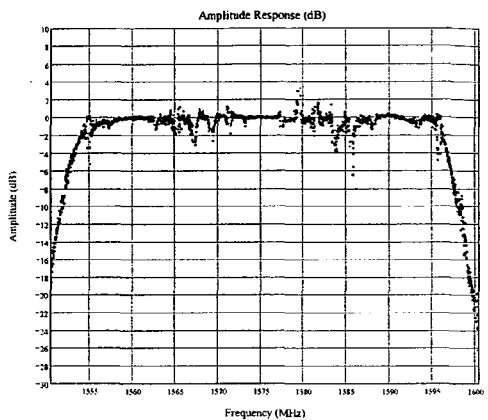
Figure 12D:
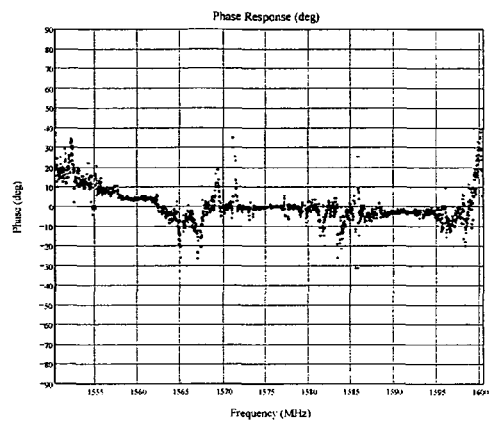
Figure 12E:
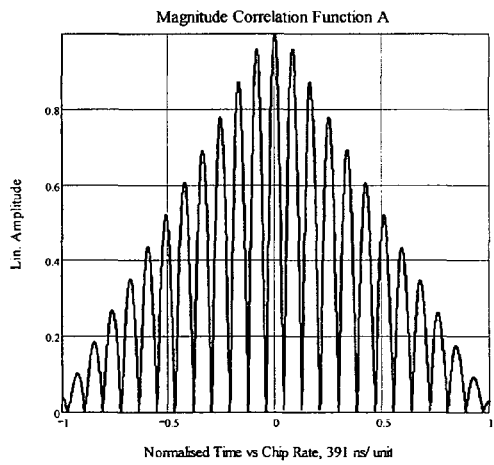
Figure 12E:
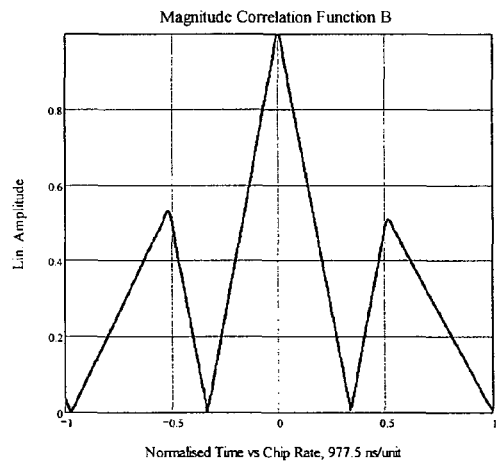
Figure 12F:
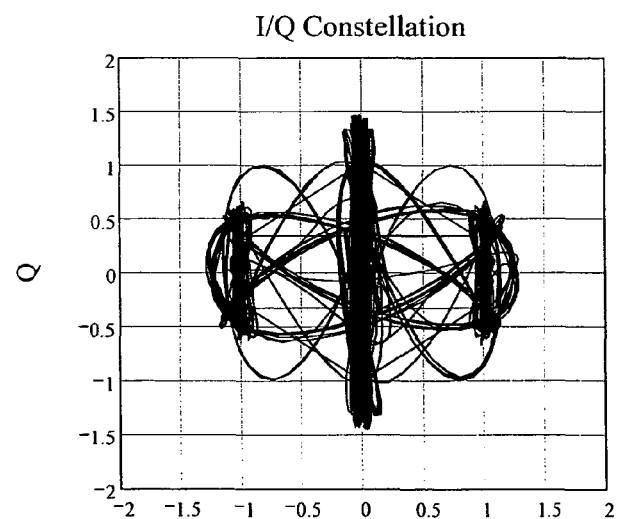

FIGS. 12A-12F demonstrate a practical result on a prototype payload using the method according to the invention. FIGS. 12A, 12B and 12C respectively represent the amplitude $A_d(\omega)$, the phase response $\phi_d(\omega)$ of the uncompensated payload; the impact on the correlation function, using the same type of signals as described for FIG. 4; and the modulation constellation. FIGS. 12C, 12D and 12E represent the same after a single iteration of the method. A significant flattening of the amplitude and phase frequency response can be observed for one single iteration, as well as a symmetrization of the correlation function and of the signal constellation. Residual distortion around signal nulls is typically reduced in additional iterations. In this case the nominal operation output signal of the payload was measured in a laboratory or ground station facility, $H_c$ was calculated, and uploaded to the payload (i.e. to the SGU) to close the compensation loop.

Various loop configurations are possible. Both open (i.e. $H_c$ is calculated in a non-iterative mode) and closed (i.e. $H_c$ is calculated in an iterative progressive mode based on preceding inputs) loop configurations are possible although the closed loop is the baseline solution in order to reach optimal compensation performances. The closed loop configuration is also ideal for dealing with parameter drifting over time (H temporal time-invariance). This in particular is interesting for maintenance operations over the lifetime of the payload. It is given that taking into account the typical time constants of the environmental parameter changes, as presented in FIG. 1, and life-time degradation, high speed and real-time performance is not mandatory. This allows implementing the compensation algorithm as a complementary background routine with low processing duty cycle. This consequently generates minimum overhead to other nominal operation satellite applications which are time critical and require large processing and link bandwidth resources onboard, i.e. attitude control and housekeeping tasks. Both non-autonomous (regular operation intervention is required) or autonomous configurations are also possible.

The invention claimed is:
1. A method for compensating signal distortion in an emitting payload including at least a high-power RF amplification module, comprising:
   (a) choosing an initial tentative compensation transfer function and introducing it within the aggregate response of the payload;
   (b) acquiring an output signal of the emitting payload;
   (c) based on the acquired output signal and on a reference signal, corresponding to an expected undistorted output signal, performing an estimation of a residual distortion transfer function of the emitting payload, the output signal being the only signal acquired from the emitting payload which is used for performing the estimation; and (d) based on the estimation of the residual distortion transfer function, computing an updated tentative compensation transfer function and introducing it within the aggregate response of the payload.

2. The method of claim 1, wherein the aggregate response of the payload and residual distortion transfer function include simultaneous linear, non-coherent and nonlinear distortion components for all frequencies.

3. The method of claim 1, wherein the tentative compensation transfer function is a linear transfer function.

4. The method of claim 1, further comprising (e) applying a nonlinear pre-distortion transfer function to the payload to reduce nonlinear contributions to its aggregate distortion.

5. The method of claim 1, wherein the aggregate payload response is time-invariant, at least in the short term, and memory-less, and the ideal reference signal is time-invariant.

6. The method of claim 1, further comprising repeating (b) to (d) iteratively until a target condition is met, indicating that a satisfactory compensation of signal distortion has been achieved.

7. The method of claim 6, wherein the tentative compensation transfer function includes a linear component in a form of a Finite-Impulse Response filter, and wherein the computing (d) comprises determining updated coefficients for the Finite Impulse Response filter.

8. The method of claim 1, wherein the reference signal is generated on-purpose, and is not measured from within the emitting payload.

9. The method of claim 1, wherein estimation of the residual distortion transfer function is performed by a black-box estimator which does not require a priori knowledge of the payload induced distortion.

10. The method of claim 9, wherein the performing black-box estimation of a residual distortion transfer function is carried out by using a cross-spectrum estimator.

11. The method of claim 1, further comprising (e) dividing the estimated residual distortion transfer function by a calibration transfer function before computing the updated tentative compensation transfer function.

12. The method of claim 11, wherein the calibration transfer function is representative of an uncertainty budget of the estimation of the residual distortion transfer function.

13. The method of claim 1, wherein the (d) computing an updated tentative compensation transfer function comprises dividing the tentative compensation transfer function computed during the previous iteration by the current estimated residual distortion transfer function.

14. The method of claim 1, wherein the target condition is a condition set on the current estimated residual distortion transfer function.

15. The method of claim 1, further comprising (e) computing a coherency function and a signal-to-noise level of the acquired output signal with respect to the reference signal; and wherein the target condition takes into account the coherency function and signal-to-noise level.

16. The method of claim 1, further comprising acquiring the nominal operation output signal at a receiving station, outside the emitting payload.

17. The method of claim 1, further comprising acquiring the output signal within the emitting payload.

18. The method of claim 1, wherein the emitting payload is a generative payload.

19. The method of claim 1, wherein the emitting payload is a spacecraft payload.

20. A method for compensating signal distortion during on-ground verification and configuration of an emitting payload that includes at least a high-power RF amplification module and that is integrated into a spacecraft as a spacecraft payload, the method comprising:

(a) choosing an initial tentative compensation transfer function and introducing it within the aggregate response of the payload;

(b) acquiring an output signal of the emitting payload;

(c) based on the acquired output signal and on a reference signal, corresponding to an expected undistorted output signal, performing an estimation of a residual distortion transfer function of the emitting payload, the output signal being the only signal acquired from the emitting payload which is used for performing the estimation; and (d) based on the estimation of the residual distortion transfer function, computing an updated tentative compensation transfer function and introducing it within the aggregate response of the payload.

21. A method for compensating signal distortion during in-space verification and configuration of a spacecraft emitting payload using a nominal operation output signal as the acquired output signal, without interruption of service, the method comprising:

(a) choosing an initial tentative compensation transfer function and introducing it within the aggregate response of the payload;

(b) acquiring an output signal of the emitting payload;

(c) based on the acquired output signal and on a reference signal, corresponding to an expected undistorted output signal, performing an estimation of a residual distortion transfer function of the emitting payload, the output signal being the only signal acquired from the emitting payload which is used for performing the estimation; and (d) based on the estimation of the residual distortion transfer function, computing an updated tentative compensation transfer function and introducing it within the aggregate response of the payload.

22. An emitting payload comprising:
means for pre-compensating signal distortion, wherein the means are adapted for carrying out the method of claim 1.

* * * * *

UNITED STATES PATENT AND TRADEMARK OFFICE
CERTIFICATE OF CORRECTION

PATENT NO. : 8,325,851 B2  Page 1 of 1
APPLICATION NO. : 12/864446
DATED : December 4, 2012
INVENTOR(S) : Dirk Hannes It is certified that error appears in the above-identified patent and that said Letters Patent is hereby corrected as shown below:

On the title page, Item (73), the Assignee's information is incorrect. Item (73) should read:

-- (73) Assignee: Agence Spatiale Europeenne, Paris (FR) --

Signed and Sealed this
Twenty-sixth Day of February, 2013

Teresa Stanek Rea
*Acting Director of the United States Patent and Trademark Office*